United States Patent [19]
Edwards

[11] Patent Number: 5,585,720
[45] Date of Patent: Dec. 17, 1996

[54] SIGNAL PROCESSING METHOD FOR MULTIEXPONENTIALLY DECAYING SIGNALS AND APPLICATION TO NUCLEAR MAGNETIC RESONANCE WELL LOGGING TOOLS

[75] Inventor: Carl M. Edwards, Bryan, Tex.

[73] Assignee: Western Atlas International, Inc., Houston, Tex.

[21] Appl. No.: 546,742

[22] Filed: Oct. 23, 1995

[51] Int. Cl.[6] ............................................. G01R 33/48
[52] U.S. Cl. .................................... 324/309; 324/303
[58] Field of Search ............................. 324/309, 300, 324/318, 322, 314, 312, 313; 128/653.2, 653.5; 333/166, 165

[56] References Cited

U.S. PATENT DOCUMENTS

| | | | |
|---|---|---|---|
| 4,016,750 | 5/1977 | Green | 73/67 |
| 4,208,687 | 6/1980 | Sun et al. | 361/20 |
| 4,223,681 | 9/1980 | Sherman | 128/672 |
| 4,634,283 | 1/1987 | Mark et al. | 356/350 |
| 4,665,486 | 5/1987 | Schultz | 324/303 |
| 4,859,945 | 8/1989 | Stokar | 324/309 |
| 4,952,876 | 8/1990 | Pelc | 324/309 |
| 4,972,325 | 11/1990 | Hara | 314/497 |
| 5,012,490 | 5/1991 | Myer | 375/58 |
| 5,065,449 | 11/1991 | Gordon et al. | 455/15 |
| 5,212,386 | 5/1993 | Gratton et al. | 250/458.1 |
| 5,369,785 | 11/1994 | Korhunen et al. | 455/54.1 |
| 5,408,202 | 5/1995 | Shirazi et al. | 331/8 |

OTHER PUBLICATIONS

SPE 28368: NMR Pore Size Distributions and Permeability at the Well Site: SPE 6th Annual Technical Conference and Exhibition, New Orleans, LA., 25–28 Sep. 1994.

SPE 20561: Spin Echo Magnetic Resonance Logging: Porosity adn Free Fluid Index Determination: SPE 69th Annual Technical Conference and Exhibition, New Orleans, LA. 25–28 Sep. 1994.

*Primary Examiner*—Sandra L. O'Shea
*Assistant Examiner*—Raymond Y. Mah
*Attorney, Agent, or Firm*—Richard A. Fagin

[57] ABSTRACT

A method of reducing bias error in nuclear magneic resonance (NMR) spin-echo signals. The method includes filtering the signals using a filter having a bandwidth inversely related to the length of time from the initiation of the measurement of the NMR signals. In a preferred embodiment, the NMR spin-echo signal measurements are filtered using a moving average filter having an averaging span which increases with respect to the time elapsed from initiation of the spin-echo measurement sequence.

6 Claims, 3 Drawing Sheets

SIGNAL PROCESSING METHOD FOR MULTIEXPONENTIALLY DECAYING SIGNALS AND APPLICATION TO NUCLEAR MAGNETIC RESONANCE WELL LOGGING TOOLS

BACKGROUND OF THE INVENTION

1. Field of the Invention

The present invention is related to the field of signal processing methods for oil well logging tools. More specifically, the present invention is related to signal processing methods for reducing noise in signal data comprising exponentially decaying signal components, in particular, spin echo decay signals from nuclear magnetic resonance (NMR) well logging instruments.

2. Description of the Related Art

Oil well logging tools include nuclear magnetic resonance (NMR) instruments. NMR instruments can be used for determining, among other things, the fractional volume of pore space and the fractional volume of mobile fluid filling the pore space of earth formations. Methods of using NMR measurements for determining the fractional volume of pore space and the fractional volume of mobile fluids are described, for example, in "Spin Echo Magnetic Resonance Logging: Porosity and Free Fluid Index Determination", M. N. Miller et al, Society of Petroleum Engineers paper no. 20561, Richardson, Tex., 1990.

NMR instruments known in the art are typically designed to make measurements corresponding to an amount of time for hydrogen nuclei present in the earth formation to realign their spin axes, and consequently their bulk magnetization, either with an externally applied magnetic field, or perpendicularly to the magnetic field, after momentary reorientation of the nuclear spin axes. The externally applied magnetic field is typically provided by a magnet disposed in the NMR instrument. The spin axes of the hydrogen nuclei in the earth formation are, in the aggregate, caused to be aligned with the magnetic field induced in the earth formation by the magnet. The NMR instrument includes an antenna positioned near the magnet and shaped so that a pulse of radio frequency (RF) power conducted through the antenna induces a magnetic field in the earth formation orthogonal to the field induced by the magnet. The RF pulse has a duration predetermined so that the spin axes of the hydrogen nuclei generally align themselves perpendicular both to the orthogonal magnetic field induced by the RF pulse and to the externally applied magnetic field. After the pulse ends, the nuclear magnetic moment of the hydrogen nuclei gradually "relax" or return to their alignment with the externally applied magnetic field. The amount of time taken for this relaxation is related to properties of interest of the earth formation.

After the RF pulse ends, the antenna is typically electrically connected to a receiver, which detects and measures voltages induced in the antenna by precessional rotation of the spin axes of the hydrogen nuclei. While the hydrogen nuclei gradually realign their spin axes with the magnet's field, they do so at different rates because of inhomogeneities in the magnet's field and because of differences in the chemical and magnetic environment within the earth formation. Different rates of realignment of the spin axes of the hydrogen nuclei results in a rapid decrease in the voltage induced in the antenna. The rapid decrease in the induced voltage is referred to as the free induction decay (FID).

After a predetermined time period following the FID, another, longer RF pulse is applied to the antenna. The longer RF pulse has a duration predetermined to realign the spin axes of the hydrogen nuclei in the earth formation by an axial rotation of 180 degrees from their immediately previous orientations. After the longer RF pulse (called a 180 degree pulse), hydrogen nuclear axes that were realigning with the externally applied field at a slower rate are then positioned so that they are "ahead" of the faster realigning spin axes. The 180 degree movement causes the faster realigning axes are reoriented to be "behind" the slower realigning axes. The faster realigning axes eventually "catch up" to, and come into approximate alignment with, the slower aligning axes after the 180 degree reorientation. As a large number of the spin axes become aligned with each other, the hydrogen nuclei again are able to induce measurable voltages in the antenna. The voltage induced as a result of realignment of the hydrogen nuclear axes with each other after a 180 degree pulse is referred to as a "spin echo". The spin echo induced voltage is smaller than the original FID voltage generated after cessation of the first RF pulse, because the aggregate nuclear axial alignment, and consequently the bulk magnetization, of the hydrogen nuclei at the time of the spin echo is at least partially realigned with the magnet's field and away from the sensitive axis of the antenna. The spin echo voltage itself rapidly decays by FID as the faster aligning nuclear axes "dephase" from the slower aligning nuclear axes.

After another period of time equal to two of the predetermined time periods between the initial 90 degree RF pulse and the first 180 degree pulse, another RF pulse, of the same duration as the pulse causing the 180 degree shift in spin axis orientation, can be applied to the antenna. This next 180 degree pulse again causes the slower realigning spin axes to be positioned ahead of the faster realigning axes, and eventually another spin echo will induce voltages in the antenna. The induced voltages of this next spin echo will typically be smaller in amplitude than the previous spin echo.

Successive 180 degree RF pulses are applied to the antenna to generate successive spin echoes, each one typically having a smaller amplitude than the previous spin echo. The rate at which the peak amplitude of the spin echoes decays is related to properties of interest of the earth formation, such as the fractional volume of pore space or the fractional volume of mobile fluid filling the pore space. The number of spin echoes needed to determine the rate of spin echo amplitude decay is related to the properties of the earth formation; in some cases as many as 1,000 spin echoes may be needed to determine the amplitude decay corresponding to the properties of the earth formation which are of interest.

When any of the RF pulses are applied to the antenna, the magnet can become physically deformed by magnetostriction. After each RF pulse is turned off, the magnet tends to return to its original shape in a series of damped mechanical oscillations, known as "ringing". Ringing induces large voltages in the antenna which can interfere with measurement of the voltages induced by the spin echoes.

A method known in the art for reducing the effect of ring-induced voltages is to make spin echo measurements in cycles known as "phase alternate pairs" (PAPS). PAPS measurements are performed by making a second set of spin echo measurements starting with an original transverse alignment (90 degree) RF pulse which is inverted in phase from the 90 degree pulse used to start the first set of spin echo measurements. Voltages induced in the antenna during the second set of spin echo measurements will be inverted in polarity from the voltages induced in the first set of measurements. The voltages from the second set of measurements can be subtracted from the voltages in the first set of measurements to substantially remove coherent noise such as the ring-induced voltages.

In order to correctly subtract the second set of voltage measurements from the first set of voltage measurements, the spin echoes from the first set and the second set must be substantially time correspondent. Small time differences between successive sets of measurements can result from variations in phase response of the antenna and of analog amplifier circuits forming part of the receiver to which the antenna is connected. The amplitude of each one of the spin echoes is typically measured by connecting the receiver to a phase sensitive detector. The phase sensitive detector measures only a voltage amplitude component having a predetermined phase relationship with respect to a phase reference. In the typical NMR instrument, the phase reference can be an oscillator which generates the RF voltages used to apply the RF pulses to the antenna. Differences in phase response of the antenna and analog amplifier circuits can be adjusted by referencing the phase sensitive detector to the oscillator.

It is known in the art to improve the signal-to-noise ratio of NMR well logging measurements by averaging a plurality of PAPS, typically eight or more.

A drawback to using phase sensitive detectors is that the signal phase must be measured precisely or the signal phase must remain constant over the duration of the measurement. The signal phase is typically not constant for the duration of the measurement because of tool motion. In addition, measurement system noise, which can include thermal noise in the electronic circuits forming the receiver, can be of sufficient amplitude to cause the phase measurements to be imprecise. In the NMR instruments known in the art, the voltage signal is rectified after phase alternate pairs are combined. Later in a spin echo measurement cycle, as the voltages induced by the spin echoes are greatly reduced in amplitude, noise in the measurement system, which can include thermal noise in the electronic circuits forming the receiver, can be of sufficient amplitude to cause absolute signal level excursions which change the polarity of the measured voltage. The detection scheme known in the art rectifies the opposite polarity voltage excursions, and the resulting spin echo amplitude signal can include apparent decay rates not representative of the properties of the earth formation.

Accordingly, it is an object of the present invention to provide a method of filtering spin echo measurement signals which reduces the effect of rectified noise in the receiver circuitry in an NMR logging instrument.

SUMMARY OF THE INVENTION

The present invention is a method of reducing bias error in NMR spin echo amplitude signals. The NMR spin-echo amplitude signals are filtered using a filter having a bandwidth inversely related to the length of time from the initiation of the measurement of the NMR spin echo amplitude signals. In a preferred embodiment the NMR spin-echo decay measurements are filtered using a moving average filter having an averaging span which increases with respect to the time elapsed from initiation of the NMR spin-echo measurement sequence.

DESCRIPTION OF THE PREFERRED EMBODIMENT

Figure 1:
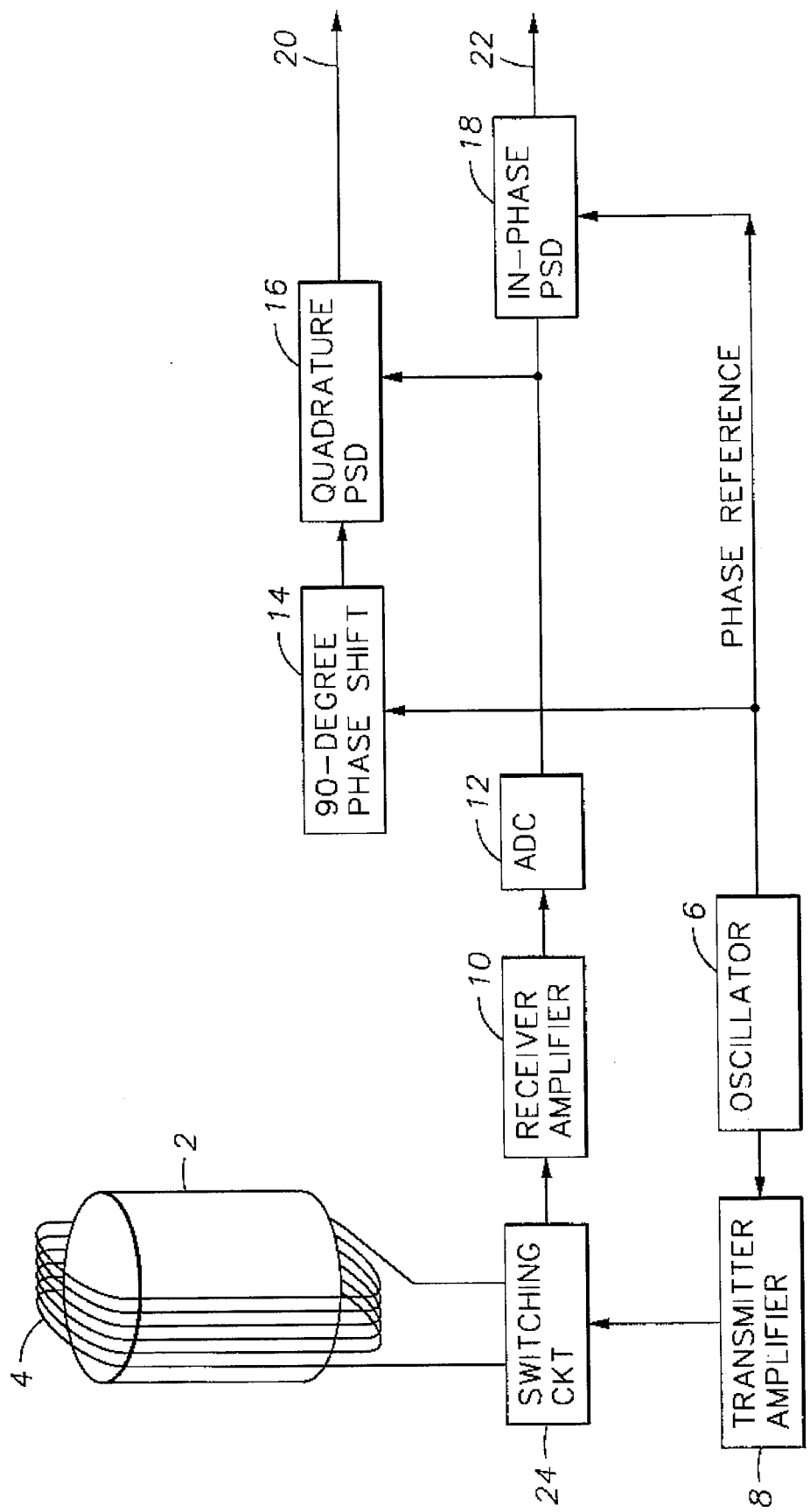
FIG. 1 shows a functional block diagram of a typical NMR spin-echo measurement apparatus.

An instrument suitable for making nuclear magnetic resonance (NMR) spin-relaxation time (spin echo) measurements of earth formations penetrated by a wellbore is described, for example, in U.S. Pat. No. 4,717,877 issued to Taicher et al. The instrument described in the Taicher et al '877 patent includes a permanent magnet for imparting a static magnetic field within the earth formations adjacent to the wellbore, an antenna coil which can be wound around the magnet, circuitry for applying pulses of radio-frequency (RF) power to the antenna coil, and circuitry for detecting voltages induced in the antenna coil as a result of nuclear spin relaxation, particularly of hydrogen nuclei present in the earth formations.

As is known in the art, the RF pulses applied to the antenna coil of NMR apparatus such as the one in the Taicher et al '877 patent typically include an initial RF pulse having a duration which reorients spin axes of hydrogen nuclei in the earth formations to be substantially perpendicular to the static magnetic field imparted by the magnet. The RF pulse induces an angular deflection of about 90 degrees in the spin axes of the hydrogen nuclei. Later in a measurement cycle, a sequence of additional RF pulses, each pulse having duration sufficient to reorient the extant nuclear spin axes by about 180 degrees, is applied to the antenna coil. The antenna coil is then connected to a receiver to detect voltages induced in the antenna coil as the nuclear spin axes "rephase", an event called the pulse-echo. The RF pulses are timed in sequences known in the art as Carr-Purcell-Meiboom-Gill (CPMG) sequences. As is understood by those skilled in the art, the amplitude of the induced voltages from spin rephasing (pulse-echo voltages) decreases after each successive 180 degree RF rephasing pulse applied to the antenna coil. The rate at which the amplitude of the successive pulse-echo voltages decays is related to properties of the earth formations such as fractional volume of pore space and the bulk volume of mobile fluids filling the pore space, as is known in the art. The significance of amplitude decay rate and the properties of the earth formation will be further explained.

As is also known in the art, the magnet is susceptible to elastic mechanical deformation as a result of applying the RF pulses to the antenna coil, an effect called magnetostriction. After each RF pulse terminates, the magnet tends to return to its original shape through a series of damped mechanical oscillations. Mechanical oscillation of the magnet inside the antenna coil induces corresponding voltages in the antenna coil. The effect of the voltages induced by magnet oscillation on the final results of the measurements can be reduced by applying the RF pulses in a sequence called phase alternating pairs (PAPS). PAPS are generated by making successive "sets" of spin-echo decay measurements beginning with an initial 90 degree RF pulse having opposite phase from the preceding initial 90 degree RF pulse which initiated the previous spin-echo decay measurement set. Having the phase of the initial 90 degree pulse inverted relative to the previous 90 degree RF pulse causes the polarity of the voltages induced by the spin-echoes of that measurement set to be inverted from those of the previous measurement set. The voltages from successive pairs of measurement sets can be subtracted from each other, so that coherent noise present in every measurement set, such as the magnet ring induced voltages, is substantially cancelled in the result.

As is understood by those skilled in the art, making PAPS measurement sets requires that the phase of the measured voltages be precisely known or determined, so that the voltages being subtracted between successive measurement sets represent precisely the same portion of each spin-echo event in each measurement set. A system typically used to measure voltages which enables subtraction of measurements from successive measurement sets can be observed by referring to FIG. 1. The magnet which imparts the static magnetic field to the earth formations is shown at 2. the magnet 2 can be surrounded by the antenna coil shown at 4. The antenna coil 4 is connected to a switching circuit 24 which selectively connects the antenna coil 4 either to a transmitter amplifier 8 or to a receiver amplifier 10. The transmitter amplifier is connected to an oscillator 6 which provides both the radio frequency (RF) energy used to pulse the antenna coil 4 and provides a phase reference for the receiver circuitry as will be further explained.

The switching circuit 24 periodically connects the antenna coil 4 to the transmitter amplifier 8. After a predetermined period of time, typically enough to reorient spin axes of hydrogen nuclei in the earth formation about 90 degrees, the switching circuit 24 connects the antenna coil 4 to the receiver amplifier 10. The receiver amplifier 10 increases the magnitude of voltages induced in the antenna coil 4 to a level compatible with the input range of an analog to digital converter (ADC) 12. The ADC 12 converts analog voltages from the amplifier 10 into a series of numbers representing the magnitude of the voltages induced in the antenna coil 4 sampled at spaced-apart time intervals. Samples output from the ADC 12 are conducted to an in-phase phase sensitive detector (R-PSD) 18 and a quadrature phase sensitive detector (X-PSD) 16. Phase reference for the R-PSD 18 and the X-PSD 16 is typically provided by the oscillator 6. Phase reference from the oscillator 6 to the X-PSD 16 is conducted through a 90 degree phase shifter 14 so that the X-PSD will determine magnitude of voltage components 90 degrees out of phase to the oscillator 6. Because the measurement of in-phase and quadrature components of the voltages induced in the antenna coil 4 is referenced to the oscillator 6, any apparent phase shifts in the induced voltages which may be caused by changes in the response of the receiver amplifier 10, or the antenna coil 4 itself can be automatically accounted for in the processing of the signal samples.

The measurement of interest is the amplitude of the induced voltages. The in-phase and quadrature components of the induced voltages can be described by the following expressions:

$$R(t)=A(t) \cos \phi \quad (1)$$

$$X(t)=A(t)i \sin \phi$$

Where R(t) is the time varying in-phase signal component (shown at output 22 in FIG. 1), X(t) is the time varying quadrature component (shown at output 20 in FIG. 1), A(t) is the signal amplitude, and i is the square root of (−1).

The signal amplitude A(t) is typically recovered by combination according to the expression:

$$A(t) = \sqrt{R^2(t) + X^2(t)} \quad (2)$$

Figure 2:
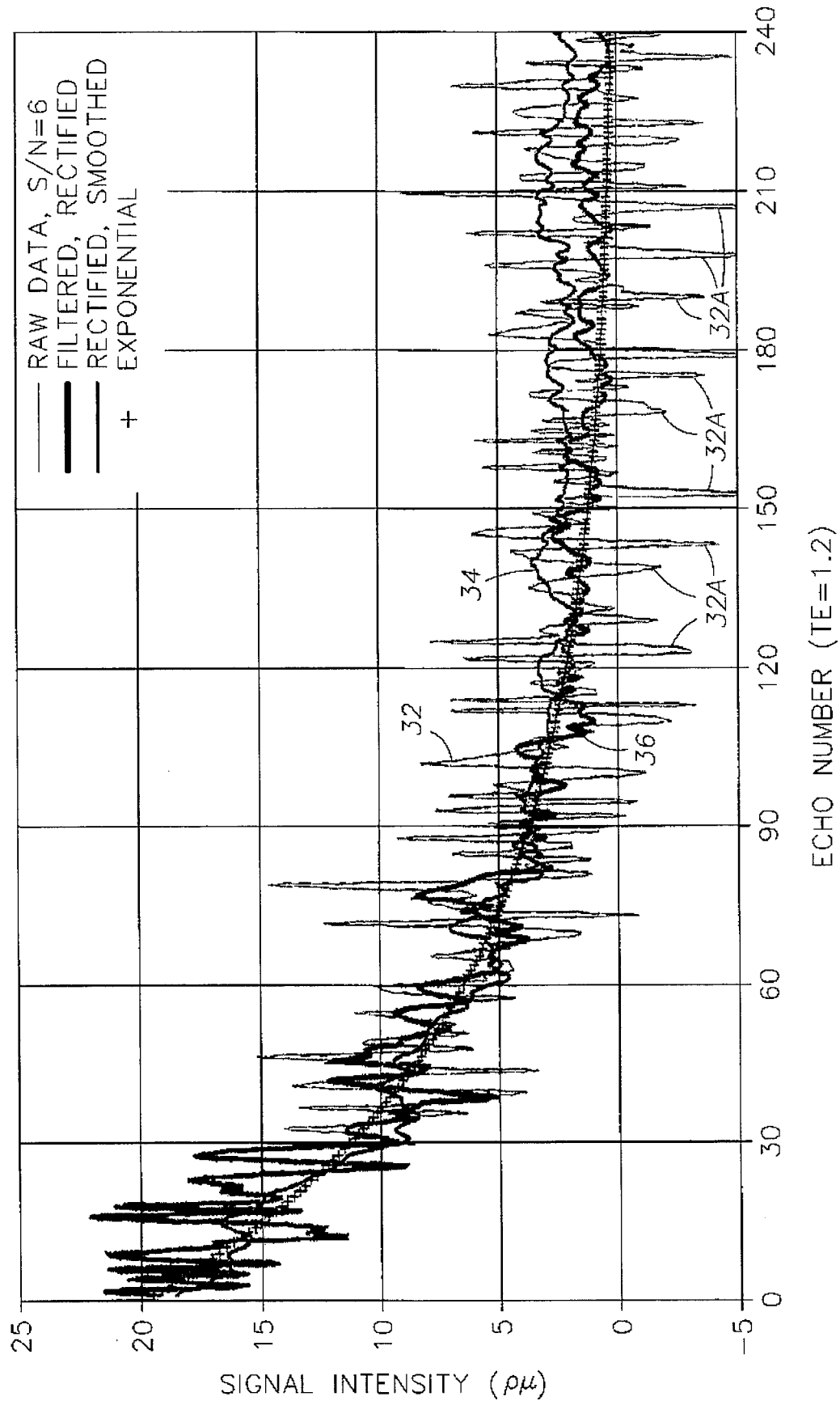
FIG. 2 shows simulated NMR amplitude decay measurement curves including a curve having simulated noise.

Signal amplitude recovery can be performed by a computer (not shown) which can be disposed in the NMR instrument or in recording equipment (not shown) disposed at the earth's surface. It is to be understood that the location of the computer (not shown) is a matter of convenience for the system designer and is not to be construed as a limitation on the present invention. A significant feature of the signal amplitude recovery according to equation (2) is that the component magnitudes are squared before summing. The result of the squaring on the signal amplitude so determined can be observed by referring to FIG. 2. FIG. 2 is a graph representing signal amplitude on the ordinate axis and time (represented by "echo number" having a time between echoes in FIG. 2 of 1.2 milliseconds) on the coordinate axis. Amplitude values were synthesized by generating a single-exponential decay curve, shown generally at 30. As is understood by those skilled in the art, a single-exponential decay curve can be described by the algebraic expression:

where I(t) is the signal magnitude at time t, $I_o$ is the signal magnitude at time zero, $$I(t)=I_o e^{(-t/T)} \quad (3)$$

and T is a so-called "decay constant" related to the exponentially decaying property which is being measured. In the example of FIG. 2, the single-exponential decay curve 30 can represent, for example, the response of the NMR instrument when immersed in a homogeneous medium such as plain water.

A synthetic induced voltage curve, shown generally at 32, was generated by adding the output of a Gaussian random number generator to the single-exponential curve 30. The Gaussian random number generator was adapted to generate the equivalent of noise in the receiver amplifier (shown at 10 in FIG. 1), which can include thermal noise. As can be observed On the synthetic induced voltage curve 32, as the single-exponential decreases to where it is small compared with the magnitude of the noise, the synthetic induced voltage curve can make excursions to values below zero, such as shown at 32A. When the signal amplitude is recovered as shown in equation (2), negative excursions can be "rectified", that is, have their signs reversed. The calculated signal amplitude may exhibit a bias, or increase in the apparent asymptotic decay value to above zero, as shown at 34. The significance of the bias will be further explained.

As is understood by those skilled in the art, the rate of decay in the signal amplitude of NMR spin-echo measurements can include contributions from a plurality of dilforent exponentially decaying factors. These factors can include hydrogen nuclei forming part of the solid rock materials of the earth formation, hydrogen nuclei in bound water of clay minerals, hydrogen nuclei in fluids bound by surface tension to the rock minerals and hydrogen nuclei in mobile fluids in the pore space of the formation. Each one of these factors can have a different value of decay constant (T from equation (3)). A description of the factors which contribute to the observed spin-echo amplitude decay rate is provided, for example, in "Spin Echo Magnetic Resonance Logging: Porosity and Free Fluid Index Determination", M. N. Miller et al, Society of Petroleum Engineers paper no. 20561, Richardson, Tex. 1990.

The previously described bias from rectification can causal erroneous calculation of the relative contributions of slower decaying components to the overall amplitude decay rate. As is described, for example, in "NMR Pore size distribution and Permeability at the Wellsite", M. G. Prammer, Society of Petroleum Engineers paper no. 28368, Richardson, Tex. 1994, the observed amplitude decay can be described as a multi-exponential continuous spectrum according to the relationship:

$$y(t) = \int P(T_2) \exp\left(-\frac{t}{T_2}\right) d(T_2) + \epsilon(t) \quad (4)$$

where $T_2$ represents the characteristic transverse relaxation time (the decay constant in equation (3)) of each individual factor contributing to the overall observed amplitude decay, and $\epsilon(t)$ represents noise in the measurement system (which can include the previously described thermal noise in the receiver).

A characteristic of factors which have shorter $T_2$ values, however, is that they contribute only very slightly to the decay amplitude at longer elapsed times from the initial 90 degree RF pulse. It is therefore possible to apply a filter to spin-echo signals later in elapsed time from the initial 90 degree RF pulse which has a smaller bandwidth than a filter applied to the earlier time signals since the faster decaying components are substantially absent from the later time signals. An example of a time-dependent filter, f(t,t'), which has such properties is a so-called "box-car" filter, which can be represented by the expression:

$$f(t,t') = \begin{cases} 1/\alpha t, & \text{when } |t'| < \alpha t/2, \\ 0, & \text{when } |t'| \geq \alpha t/2 \end{cases} \quad (5)$$

where $\alpha$ is a "filter constant" constant having a value much less than 1. Another filter which has desirable characteristics can be described by the expression: wherein $\beta$ represents an additional filter constant. The filters in equations (5) and (6)

$$f(t,t') = 1/(\alpha t + 1/\beta), \text{ when } |t'| < \alpha t/2 \pm \beta t' \pm \quad (6)$$

$$\frac{\alpha \beta t}{2} + \frac{1}{\beta} \; (\alpha t + 1/\beta)^{-1}, \text{ when } \alpha t/2 < |t'| < (\alpha t/2) + (1/\alpha \beta t)$$

can be described as moving average filters having an averaging span which increases as the elapsed time from the initial 90 degree RF pulse increases. The filters described in equations (5) and (6) can be more generally described as "decreasing bandwidth" filters. Decreasing bandwidth filters comprise frequency response which decreases as the time from initiation of the spin-echo decay measurement increases. It is to be understood that the selection of the moving average types of filters described in equations (5) and (6) is a matter of convenience for the system designer and is not meant to be an exclusive representation of the types of filters which will provide the improvement of the present invention. As is understood by those skilled in the art, it would be equally possible to design a filter in the frequency domain which has decreasing bandwidth with respect to time. A generalized expression for the frequency response of filters which will perform the function of the present invention can be shown as follows:

$$F(t,\omega) = \frac{1}{\sqrt{2\pi}} \int dt' f(t,t') \exp[-i\omega t'] \quad (7)$$

where $\omega$ represents the angular frequency ($f=2\pi\omega$). A generalized expression for the RMS bandwidth can be shown as:

$$\Delta\omega^2_{rms}(t) = -d\omega\omega^2 F(t,\omega) \quad (8)$$

In the present embodiment of the invention, the filter can be applied to the R(t) and X(t) signal component measurements prior to determining the amplitude according to equation (1). Applying the filter prior to determining the amplitude can reduce the number and magnitude of negative amplitude excursions in the later time signals caused by noise. Having fewer negative amplitude excursions in the later time signals can reduce the bias caused by rectification of the negative excursions during amplitude calculation.

TEST RESULT

Referring once again to FIG. 2, curve 36 represents amplitude values calculated according to equation (1) after a filter according to equation (6) was applied to the R(t) and X(t) signal component measurements. Curve 36 exhibits far less bias at later times when compared with amplitude values calculated according to the methods of the prior art, shown as curve 34. For the filter which was used on the signal values shown in FIG. 2, the filter variable $\alpha$, as used in equation (5), is set to 0.033/TE, where TE represents the time between spin echoes (1.2 milliseconds for the data shown in FIG. 2), and which for the data shown in FIG. 2 corresponds to a change in filter width every 30 echoes.

Figure 3:
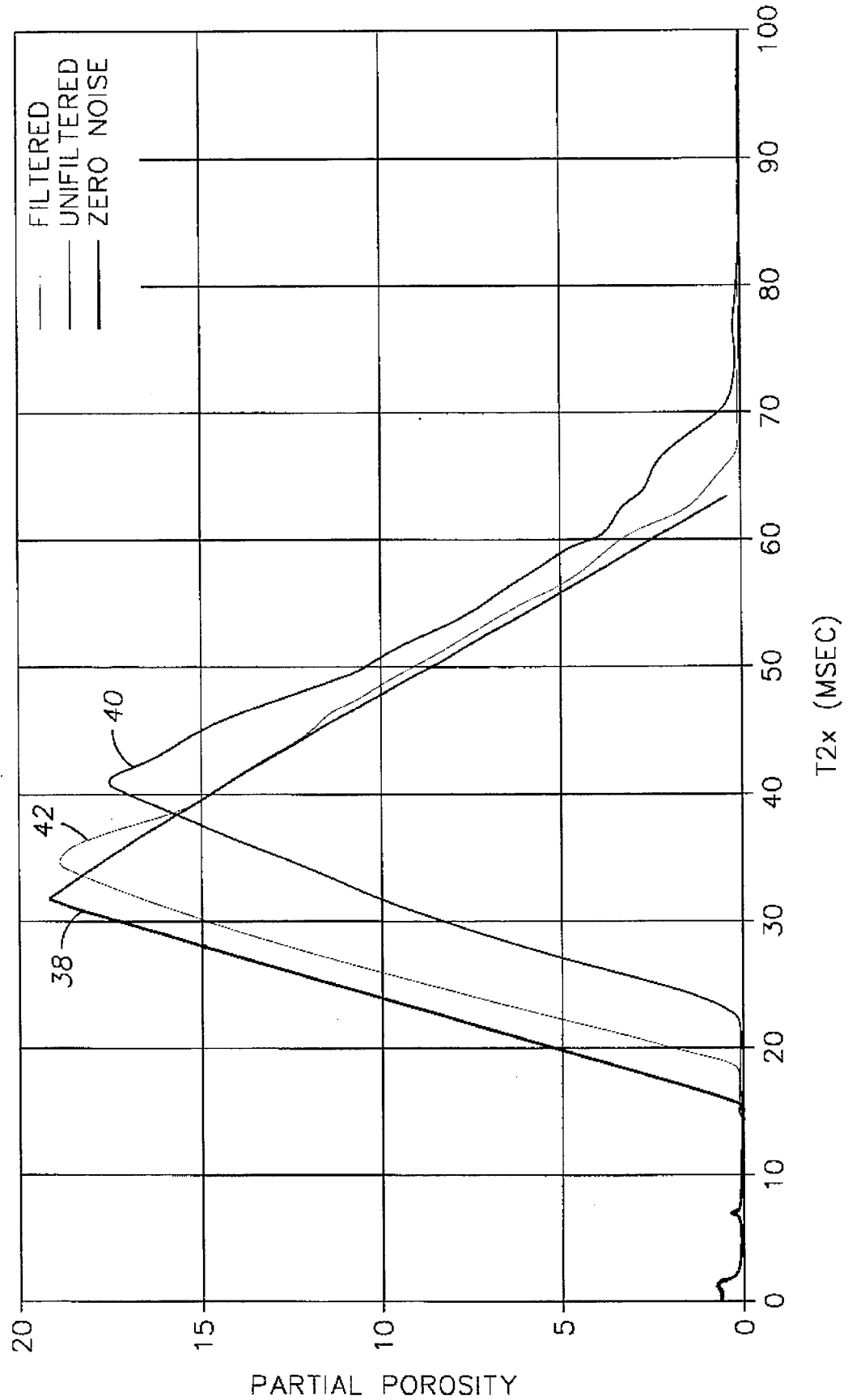
FIG. 3 shows results of calculation of an NMR decay spectrum using the method of the present invention compared to the results using the prior art method.

A comparison of the results obtained in determining the $T_2$ spectrum using the method of the present invention can be observed by referring to FIG. 3. A synthetic decay curve was constructed using a single exponential. The single exponential was decomposed into amplitudes of a sum of exponentials with fixed decay rates of 4, 8, 32, 64, 128, 256 and 512 milliseconds. The relative contribution to the overall synthetic decay spectrum of each one of the factors can be observed on curve 38 in FIG. 3. Decomposition of the decay curve can be performed by methods known in the art, and described for example in the Prammer reference, supra. The synthetic decay spectrum was then adulterated by adding noise generated by a Gaussian random number generator. The noise amplitude was set to provide the synthetic noisy decay curve used for the test with a signal-to-noise ratio of 6. Decomposition of the unfiltered decay curve is shown at curve 40. After filtering using the filter of the present invention, analysis of the decay spectrum generated the result shown in curve 42. As can be observed by comparison of curves 40 and 42, a shift in the spectral peak of the unfiltered decay curve, which can at least partially be attributed to the previously described bias, is substantially removed from the spectrum analyzed from the filtered decay curve. Curve 42 shows substantial agreement with the synthetic decay spectrum absent the noise shown in curve 38.

The embodiment disclosed herein is meant to serve only as an example of the method of the present invention. Those skilled in the art will readily devise other embodiments which do not depart from the spirit of the invention disclosed herein. Therefore the present invention should be limited in scope only by the claims appended hereto.

What is claimed is:

1. A method of reducing noise and bias error from signal amplitude detection in nuclear magnetic resonance signals comprising filtering said signals using a filter having a bandwidth inversely related to a length of time from initiation of measurement of said nuclear magnetic resonance signals.

2. The method as defined in claim 1 wherein said step of filtering comprises:
   at predetermined times within a measurement of said exponentially decaying signals, calculating an average of a segment of said measurement, said segment having a length of time corresponding to time elapsed beginning at initiation of said measurement and ending at each of said predetermined times; and designating said average for each said predetermined time as a value of amplitude of said decay measurement at each said predetermined time.

3. A method of reducing bias error and noise in NMR spin-echo amplitude decay measurements comprising the steps of:

measuring amplitudes of in-phase components and quadrature components of voltages induced in an antenna in response to spin-echo events;

filtering said in-phase and said quadrature components using a filter having a bandwidth inversely related to a time at which said components were measured relative to initiation of a spin-echo measurement sequence;

combining said filtered in-phase and said filtered quadrature components to recover said spin-echo amplitude.

4. The method as defined in claim 3 wherein said step of filtering comprises:

at predetermined times within each of said spin-echo amplitude measurements, calculating an average of a segment of said spin-echo amplitude measurements, a length of time of said segment corresponding to time elapsed beginning at initiation of said spin-echo amplitude measurements and ending at each of said predetermined times; and designating said average for each said predetermined time as a value of amplitude of said spin-echo amplitude measurements at each said predetermined time.

5. A method of determining a decay spectrum of NMR spin-echo amplitude measurements comprising the steps of;

measuring amplitudes of in-phase components and quadrature components of voltages induced in an antenna in response to spin-echo events;

filtering said in-phase and said quadrature components using a filter having a bandwidth inversely related to a time at which said components were measured relative to initiation of a spin-echo measurement sequence;

combining said filtered in-phase and said filtered quadrature components to recover spin-echo amplitude;

decomposing said spin-echo amplitude into component $T_2$ exponential decay factors.

6. The method as defined in claim 5 wherein said step of filtering comprises:

at predetermined times within said spin-echo measurement sequence, calculating an average of a segment of said sequence, a length of time of said segment corresponding to time elapsed beginning at initiation of said sequence and ending at each of said predetermined times; and designating said average for each said predetermined time as a value of amplitude of said sequence at each said predetermined time.

* * * * *